(12) United States Patent
Yang et al.

(10) Patent No.: US 10,741,477 B2
(45) Date of Patent: Aug. 11, 2020

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Cheng-Lung Yang, Kaohsiung (TW); Chih-Hung Su, Hsinchu (TW); Chen-Shien Chen, Hsinchu County (TW); Hon-Lin Huang, Hsinchu (TW); Kun-Ming Tsai, Hsinchu (TW); Wei-Je Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 65 days.

(21) Appl. No.: 15/933,396

(22) Filed: Mar. 23, 2018

(65) Prior Publication Data

US 2019/0295925 A1    Sep. 26, 2019

(51) Int. Cl.
| | | |
|---|---|---|
| *H01L 23/48* | (2006.01) | |
| *H01L 23/00* | (2006.01) | |
| *H01L 23/528* | (2006.01) | |
| *H01L 21/48* | (2006.01) | |

(52) U.S. Cl.
CPC ........ *H01L 23/481* (2013.01); *H01L 21/4853* (2013.01); *H01L 23/528* (2013.01); *H01L 24/10* (2013.01); *H01L 24/81* (2013.01); *H01L 2224/0401* (2013.01); *H01L 2224/3213* (2013.01)

(58) Field of Classification Search
None
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2006/0022286 A1* | 2/2006 | Leuschner | H01L 21/76852 257/421 |
| 2008/0048562 A1* | 2/2008 | Matsuda | H01L 27/3244 313/506 |

(Continued)

*Primary Examiner* — Walter H Swanson
*Assistant Examiner* — Kien C Ly
(74) *Attorney, Agent, or Firm* — JCIPRNET

(57) ABSTRACT

Semiconductor devices and methods of forming the same are disclosed. One of the semiconductor devices includes a first conductive layer, an organic layer, a silicon layer, a magnetic layer and a second conductive layer. The organic layer is disposed over and exposes a portion of the first conductive layer. The silicon layer is disposed on and in contact with the organic layer. The magnetic layer is disposed over the first conductive layer. The second conductive layer is disposed over the organic layer and the magnetic layer to electrically connect the first conductive layer.

20 Claims, 6 Drawing Sheets

(56) References Cited

U.S. PATENT DOCUMENTS

| | | | |
|---|---|---|---|
| 2010/0246152 A1* | 9/2010 | Lin | H01L 21/563 361/783 |
| 2011/0024842 A1* | 2/2011 | Ferrao de Paiva Martins | H01L 29/78603 257/347 |
| 2015/0340422 A1* | 11/2015 | Lee | H01F 27/2804 257/531 |
| 2019/0103583 A1* | 4/2019 | Kim | H01L 27/322 |

* cited by examiner

SEMICONDUCTOR DEVICES AND METHODS OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

Generally, an inductor is a passive electrical component that can store energy in a magnetic field created by an electric current passing through it. Inductors may be utilized in a wide variety of applications. However, there are many challenges related to the semiconductor devices including the inductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
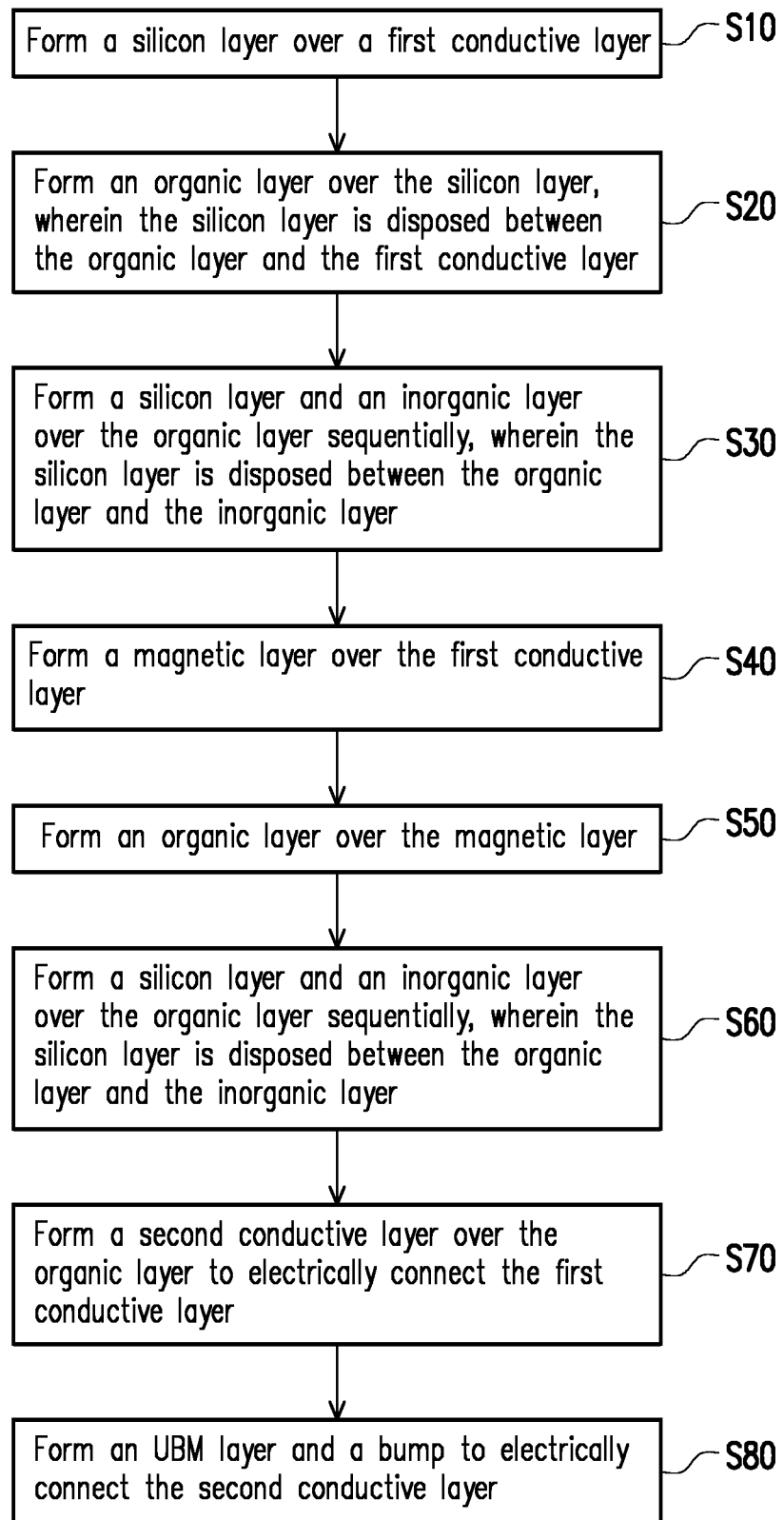
FIG. 1 is a flowchart showing a method of forming a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a flowchart showing a method of forming a semiconductor device in accordance with some embodiments of the disclosure. FIG. 2A to FIG. 2E are schematic cross-sectional views of a method of forming a semiconductor device in accordance with some embodiments.

Figure 2A:
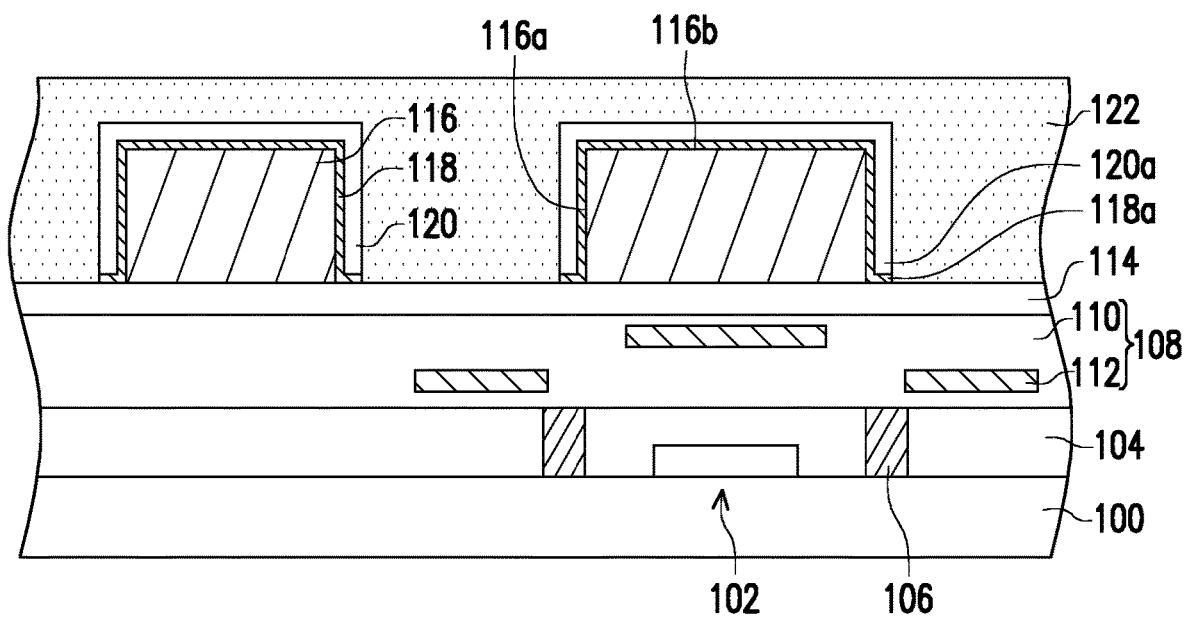
FIG. 2A to FIG. 2E are schematic cross-sectional views of a method of forming a semiconductor device in accordance with some embodiments.

Referring to FIGS. 1 and 2A, in Step S10, a silicon layer 118 is formed over a first conductive layer 116. In some embodiments, a substrate 100 is provided. The substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein.

An electrical circuit 102 is formed over the substrate 100. In some embodiments, the electrical circuit 102 includes gate stacks formed by dielectric layers and electrode layers. The dielectric layers may include an interfacial layer (IL) and a high-k layer having a dielectric constant greater than about 4, greater than about 8 or even greater than about 10. The dielectric layers are deposited by suitable techniques, such as chemical vapor deposition (CVD), atomic layer deposition (ALD), physical vapor deposition (PVD), thermal oxidation, a combination thereof, or the like. The electrode layers may include a single layer or multiple layers, such as a metal layer, a liner layer, a wetting layer, an adhesion layer, a combination thereof, or the like, and may be formed by ALD, PVD, CVD or the like.

An inter-layer dielectric (ILD) layer 104 is formed over the substrate 100. In some embodiments, the ILD layer 104 covers the electrical circuit 102. In some embodiments, the ILD layer 104 includes a low-k dielectric material having a dielectric constant less than about 4, less than about 3.5 or even less than about 3. The low-k material includes phosphosilicate glass (PSG), borophosphosilicate glass (BPSG), fluorinated silicate glass (FSG), silicon oxycarbide (SiO$_x$C$_y$), Spin-On-Glass (SOG), Spin-On-Polymer (SOP), a combination thereof, or the like. The ILD layer 104 may be formed by a suitable method, such as spinning, CVD or plasma-enhanced CVD (PECVD). The ILD layer 104 may have a single-layer or multi-layer structure.

Contacts 106 are formed through the ILD layer 104 to provide electrical contacts to the electrical circuit 102. In some embodiments, openings are formed in the ILD layer 104 by photolithography and etching processes. The openings may be lined with a diffusion barrier layer and/or an adhesion layer (not shown), and filled with a conductive material. In some embodiments, the diffusion barrier layer incudes TaN, Ta, TiN, Ti, CoW, a combination thereof, or the like, and the conductive material includes copper, tungsten, aluminum, silver, a combinations thereof, or the like.

An interconnect structure 108 is formed over the substrate 100. In some embodiments, the interconnect structure 108 is formed on the ILD layer 104. In some embodiments, the interconnect structure 108 includes one or more inter-metal dielectric (IMD) layers 110 and the associated metallization features 112 (e.g., metal layers and vias) embedded in the IMD layers 110. Generally, the one or more IMD layers 110 and the associated metallization features 112 are used to interconnect the electrical circuit 102 to each other and to provide an external electrical connection. The IMD layers 110 include a low-k dielectric material having a dielectric constant less than about 4, less than about 3.5 or even less than about 3. The low-k material includes PSG, BPSG, FSG, $SiO_xC_y$, SOG, SOP, a combination thereof, or the like. In some embodiments, the IMD layers 110 is formed by a suitable method, such as spinning, CVD or PECVD.

In some embodiments, one or more insulating etch stop layers (not shown) may be positioned between adjacent ones of the dielectric layers, e.g., the ILD layer 104 and the IMD layers 110. The insulating etch stop layers are formed of a dielectric material having a different etch selectivity from adjacent layers. In some embodiments, the insulating etch stop layers may be formed of SiN, SiCN, SiCO, a combination thereof, or the like, and may be formed by a suitable method, such as CVD or PECVD.

A passivation layer 114 is formed over the substrate 100. In some embodiments, the passivation layer 114 is formed on the IMD layers 110. In some embodiments, the passivation layer 114 may be formed of a dielectric material, such as SiN, a plasma-enhanced oxide (PEOX), a plasma-enhanced SiN (PE-SiN), plasma-enhanced undoped silicate glass (PE-USG), a high density plasma (HDP) chemical vapor deposition (CVD) oxide, a combination thereof, or the like. The passivation layer 114 is formed to protect the underlying layers from various environmental contaminants.

The first conductive layer 116 is formed over the passivation layer 114. In some embodiments, the first conductive layer 116 includes aluminum, copper or a copper alloy. In some embodiments, the first conductive layer 116 may be formed by an electro-plating process. In alternative embodiments, the first conductive layer 116 may include a copper layer coated with electro-less nickel electro-less palladium immersion gold (ENEPIG), which includes a nickel layer, a palladium layer on the nickel layer, and a gold layer on the palladium layer. The gold layer may be formed using immersion plating. In yet alternative embodiments, other conductive materials may be used to form the first conductive layer 116. It should be appreciated by those skilled in the art that the number and the size of the first conductive layers 116 is merely an example, and the number and the size of the first conductive layers 116 is not limited by the embodiments of the disclosure.

In some embodiments, the silicon layer 118 is formed on an exposed surface of the first conductive layer 116. In some embodiments, the silicon layer 118 is formed on and in physical contact with a sidewall 116a and a top surface 116b of the first conductive layer 116. In some embodiments, the silicon layer 118 has a silicon concentration not lower than 40%. In some embodiments, the silicon concentration of the silicon layer 118 ranges from 40% to 100%. In some embodiments, the silicon layer 118 is an amorphous silicon layer. In some embodiments, the silicon layer 118 is a nitrogen free layer, for example. In some embodiments, the silicon layer 118 is an oxygen free layer, for example. The silicon layer 118 may be formed by a suitable method, such as CVD or PECVD. The precursor gases of the deposition process include silicon-containing gases, which may be silane-based gases such silane, methyl-silane (1MS), di-methyl-silane (2MS), tri-methyl-silane (3MS), and combinations thereof. In addition, carrier gases that do not react with the precursor gases may be added, wherein the carrier gases may include inert gases such as helium, argon, and the like. The precursor gases may, or may not, include other gases that react with the silicon-containing gases. In some embodiments, the precursor gas for forming the silicon layer 118 includes silane, and the carrier gas includes argon, for example. The silicon layer 118 may be a substantially conformal layer, wherein a thickness thereof on the sidewall 116a of the first conductive layer 116 and a thickness thereof on the top surface 116b are close to each other, for example. In some embodiments, the thicknesses of the silicon layer 118 may be larger than 500 angstroms. In some embodiments, the thicknesses of the silicon layer 118 may be less than about 1 µm. The silicon layer 118 may have a single-layer or multi-layer structure.

In some embodiments, a dielectric layer 120 is formed over the silicon layer 118. In some embodiments, the dielectric layer 120 is in physical contact with the silicon layer 118. In some embodiments, the dielectric layer 120 includes an inorganic material such as SiN, SiC, SiCN, SiCO, SiON, $SiO_x$, nitrogen-oxide-nitrogen (NON), oxide-nitrogen-oxide (ONO) or a combination thereof, or the like, and may be formed by a suitable method, such as CVD or PECVD. The dielectric layer 120 may have a single-layer or multi-layer structure. A thickness of the dielectric layer 120 may range from about 2000 angstroms to 2.5 µM, for example.

In some embodiments, a material layer (not shown) of the silicon layer 118 and a material layer (not shown) of the dielectric layer 120 are sequentially blanket formed on the first conductive layer 116 and the passivation layer 114, and the material layers of the silicon layer 118 and the dielectric layer 120 are patterned by using a same mask, to form the dielectric layer 120 and the silicon layer 118. Therefore, as shown in FIG. 2A, a bottom portion 118a of the silicon layer 118 is below a bottom portion 120a of the dielectric layer 120, for example.

Referring to FIGS. 1 and 2A, in Step S20, an organic layer 122 is formed over the silicon layer 118, wherein the silicon layer 118 is disposed between the organic layer 122 and the first conductive layer 116. In some embodiments, the organic layer 122 is formed over the substrate 100 to cover the first conductive layer 116 and filled in the opening between the first conductive layers 116. In some embodiments, the organic layer 122 is disposed on the dielectric layer 120 over the sidewall 116a and the top surface 116b of the first conductive layer 116, and is in physical contact with the dielectric layer 120. In some embodiments, the organic layer 122 may be formed of a polymer containing carbon and oxygen, such as an epoxy, polyimide, benzocyclobutene (BCB), polybenzoxazole (PBO) or the like. A thickness of the organic layer 122 is larger than 30 µm, for example. The organic layer 122 may have a single-layer or multi-layer structure. The organic layer 122 may be formed by a suitable method such as spin-coating, lamination, deposition or the like. In some embodiments, since the silicon layer 118 is formed between the organic layer 122 and the first conductive layer 116, the adhesion of the organic layer 122 to the first conductive layer 116 is improved. Accordingly, the delamination of the organic layer 122 from the first conductive layer 116 is prevented, and the reliability of the semiconductor device is improved.

Figure 2B:
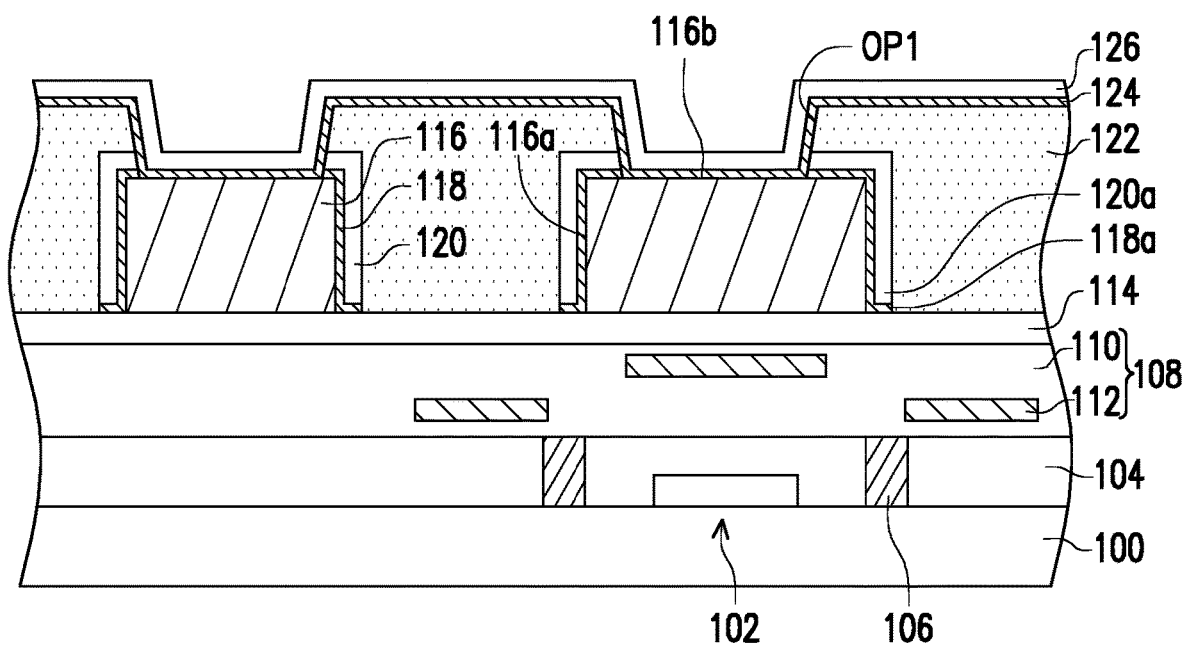

Referring to FIG. 2B, an opening OP1 is formed in the silicon layer 118, the dielectric layer 120 and the organic layer 122, to expose a portion of the first conductive layer 116. In some embodiments, the opening OP1 is formed by photolithography and etching processes. The etching process may be a wet etching process or a dry etching process.

Referring to FIGS. 1 and 2B, in Step S30, a silicon layer 124 and an inorganic layer 126 are formed over the organic layer 122 sequentially, wherein the silicon layer 124 is disposed between the organic layer 122 and the inorganic layer 126. In some embodiments, the silicon layer 124 is blanket formed on the organic layer 122, and the inorganic layer 126 is blanket formed on the silicon layer, for example. In some embodiments, before forming the silicon layer 124, a plasma treatment may be performed on an exposed surface of the organic layer 122. The plasma treatment is an argon plasma treatment, for example. In some embodiments, by the plasma treatment, a carbon rich surface of the organic layer 122 may be changed into an oxygen rich surface, for example. In some embodiments, the silicon layer 124 is formed on a modified surface of the organic layer 122. In some embodiments, a Si—O bond may be formed between the silicon atom at the surface of the silicon layer 124 and the oxygen atom at the modified surface of the organic layer 122, for example. In addition, a Si—Si bond and/or a Si—H bond may be formed between the silicon layer 124 and the organic layer 122. In some embodiments, the silicon layer 124 may be deposited by using silane as the precursor gas and argon as the carrier gas. In the case of using the argon as the carrier gas, the plasma treatment may be omitted since the argon functions as the plasma treatment. The material and forming method of the silicon layer 124 may be similar to those of the silicon layer 118, and the details are iterated herein. In some embodiments, the materials of the silicon layer 118 and the silicon layer 124 may be the same or different. The silicon concentrations of the silicon layer 118 and the silicon layer 124 may be the same or different.

The inorganic layer 126 is formed on the silicon layer 124. In some embodiments, the inorganic layer 126 includes SiN, SiC, SiCN, SiCO, SiON, $SiO_x$, nitrogen-oxide-nitrogen (NON), oxide-nitrogen-oxide (ONO) or a combination thereof, or the like, and may be formed by a suitable method, such as CVD or PECVD. The inorganic layer 126 may have a single-layer or multi-layer structure. A thickness of the inorganic layer 126 ranges from about 2000 angstroms to 2.5 µm, for example. In some embodiments, a covalent bond such as a Si—N bond and/or Si—O bond may be formed between the silicon layer 124 and the inorganic layer 126 containing nitride and/or oxide, for example.

In some embodiments, a covalent bond such as a Si—O bond, a Si—Si bond and/or a Si—H bond is formed between the silicon layer 124 and the organic layer 122 while the silicon layer 124 is formed on the organic layer 122. A covalent bond such as a Si—N bond and/or Si—O bond may be formed between the silicon layer 124 and the inorganic layer 126 containing nitride and/or oxide while the inorganic layer 126 is deposited on the silicon layer 124, for example. In some embodiments, by inserting the silicon layer 124 between and in physical contact with the organic layer 122 and the inorganic layer 126, the covalent bonds instead of hydrogen bonds are formed between the silicon layer 124 and the organic layer 122 and the silicon layer 124 and the inorganic layer 126. Accordingly, the inorganic layer 126 is adhered to the organic layer 122 through the interposed silicon layer 124, and the adhesion between the inorganic layer 126 and the organic layer 122 is improved. In some embodiments, when viewed on a microscopic scale, an interface between the silicon layer 124 and the organic layer 122 or between the silicon layer 124 and the inorganic layer 126 is smooth, and burrs at the interface, which indicate the delamination, are significantly reduced. In addition, the silicon layer 124 is disposed between the first conductive layer 116 and the inorganic layer 126, and thus the inorganic layer 126 is not in contact with the first conductive layer 116. Accordingly, delamination of the inorganic layer 126 from the first conductive layer 116 is prevented.

Figure 2C:
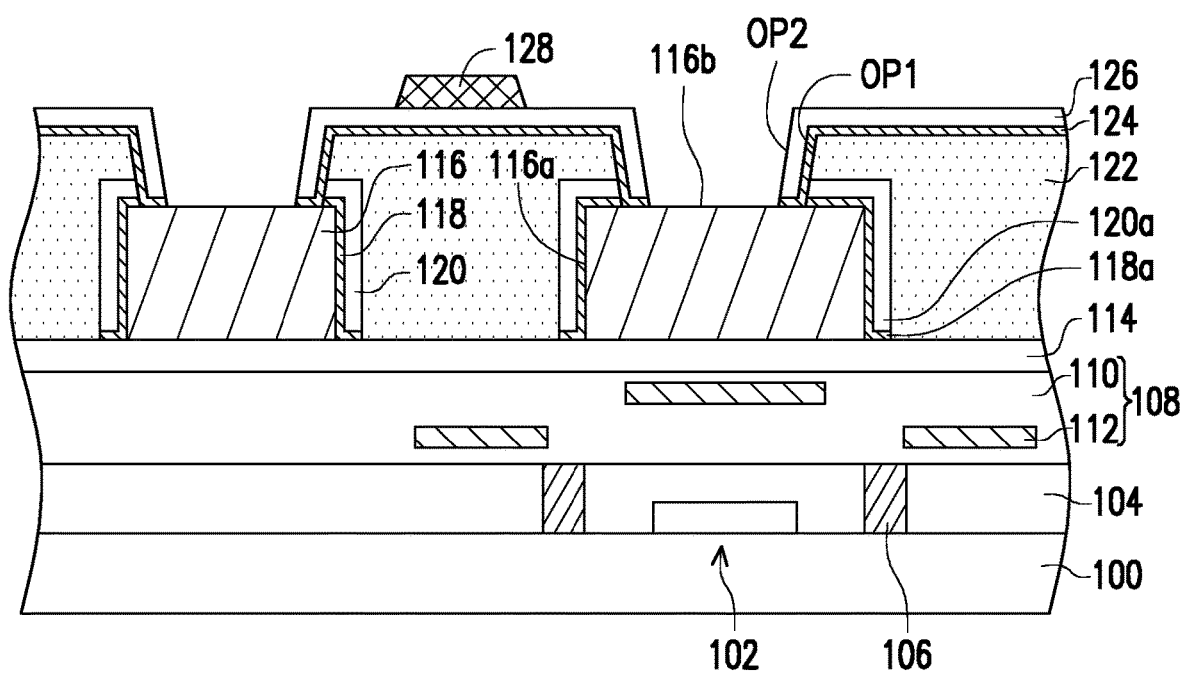

Referring to FIG. 2C, an opening OP2 is formed in the silicon layer 124 and the inorganic layer 126 to expose the first conductive layer 116. In some embodiments, the opening OP2 is formed by patterning the silicon layer 124 and the inorganic layer 126 using a same mask. That is, the opening OP2 is formed by photolithography and etching processes. In some embodiments, the opening OP2 is disposed in the opening OP1.

Referring to FIGS. 1 and 2C, in Step S40, a magnetic layer 128 is formed over the first conductive layer 116. In some embodiments, the magnetic layer 128 is formed on the inorganic layer 126 over the first conductive layer 116. In some embodiments, the magnetic layer 128 includes a magnetic metal material containing cobalt (Co), zirconium (Zr), tantalum (Ta) and niobium (Nb), rhenium (Re), neodymium (Nd), praseodymium (Pr), dysprosium (Dy) or a combination thereof. In some embodiments, the magnetic layer 128 includes an amorphous cobalt (Co) alloy including cobalt (Co) and zirconium (Zr). Zirconium (Zr) helps to make cobalt (Co) amorphous. In some embodiments, the magnetic layer 128 includes a cobalt-zirconium (CoZr) alloy having one or more additional elements, such as tantalum (Ta) and niobium (Nb). In some other embodiments, magnetic layer 128 includes a cobalt-zirconium (CoZr) alloy having one or more additional elements, such as a rare earth element, that helps to increase the ferromagnetic resonance of the cobalt-zirconium (CoZr) alloy. The rare earth element include rhenium (Re), neodymium (Nd), praseodymium (Pr), or dysprosium (Dy). In some embodiments, the magnetic layer 128 includes CoZrTa, CoZr, CoZrRe, NiFe or a combination thereof. The magnetic layer 128 may be formed by a suitable method such as PVD, CVD or the like.

Figure 2D:
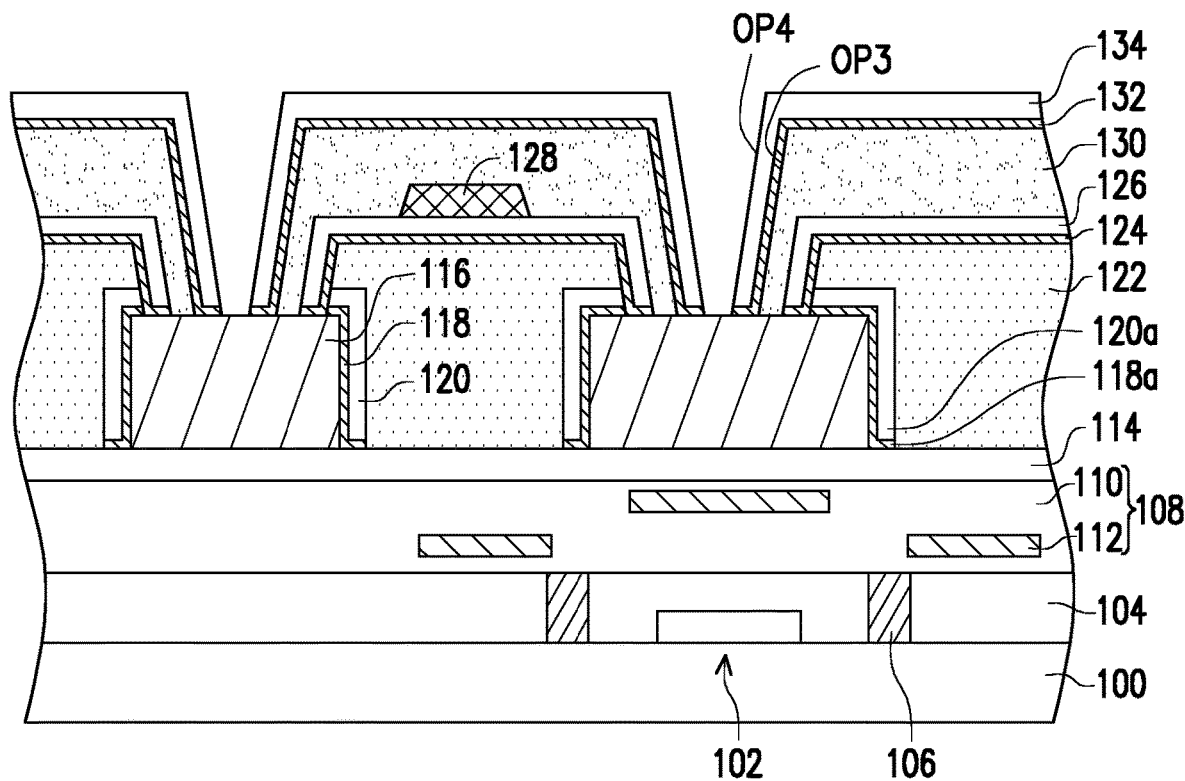

Referring to FIGS. 1 and 2D, in Step S50, an organic layer 130 is formed over the magnetic layer 128. In some embodiments, the organic layer 130 is formed on the inorganic layer 126 to cover the magnetic layer 128. The material and forming method of the organic layer 130 may be similar to those of the organic layer 122, and the details are iterated herein. In some embodiments, the materials of the organic layer 122 and the organic layer 130 may be the same or different. An opening OP3 is formed in the organic layer 130 to expose the first conductive layer 116, and the opening OP3 is disposed in the opening OP2. The opening OP3 is formed by photolithography and etching processes.

Referring to FIGS. 1 and 2D, in Step S60, a silicon layer 132 and an inorganic layer 134 are formed over the organic layer 130 sequentially, wherein the silicon layer 132 is disposed between the organic layer 130 and the inorganic layer 134. In some embodiments, the silicon layer 132 is formed on the organic layer 130, and the inorganic layer 134 is formed on the silicon layer 132. The silicon layer 132 and the inorganic layer 134 include an opening OP4 to expose a portion of the first conductive layer 116. The opening OP4 is formed by photolithography and etching processes, and the opening OP4 is disposed in the opening OP3. The materials and forming methods of the silicon layer 132 and the inorganic layer 134 may be similar to those of the silicon layer 124 and the inorganic layer 126, and the details are iterated herein. In some embodiments, the materials of the silicon layer 132 and the silicon layers 118, 124 may be the same or different. In some embodiments, the materials of the inorganic layer 134 and the inorganic layer 126 may be the same or different. In some embodiments, a covalent bond such as a Si—O bond, a Si—Si bond and/or a Si—H bond may be formed between the organic layer 130 and the silicon layer 132 while the silicon layer 132 is formed on the organic layer 130. In addition, a covalent bond such as a Si—N bond and/or Si—O bond may be formed between the silicon layer 132 and the inorganic layer 134 containing nitride and/or oxide while the inorganic layer 134 is deposited on the silicon layer 132, for example. In some embodiments, by inserting the silicon layer 132 between and in physical contact with the organic layer 130 and the inorganic layer 134, the covalent bonds instead of hydrogen bonds are formed between the silicon layer 132 and the organic layer 130 and the silicon layer 132 and the inorganic layer 134. Accordingly, the inorganic layer 134 is adhered to the organic layer 130 through the interposed silicon layer 132, and the adhesion between the inorganic layer 134 and the organic layer 130 is improved. In addition, the silicon layer 132 is disposed between the first conductive layer 116 and the inorganic layer 134, and thus the inorganic layer 134 is not in contact with the first conductive layer 116. Accordingly, delamination of the inorganic layer 134 from the first conductive layer 116 is prevented.

Figure 2E:
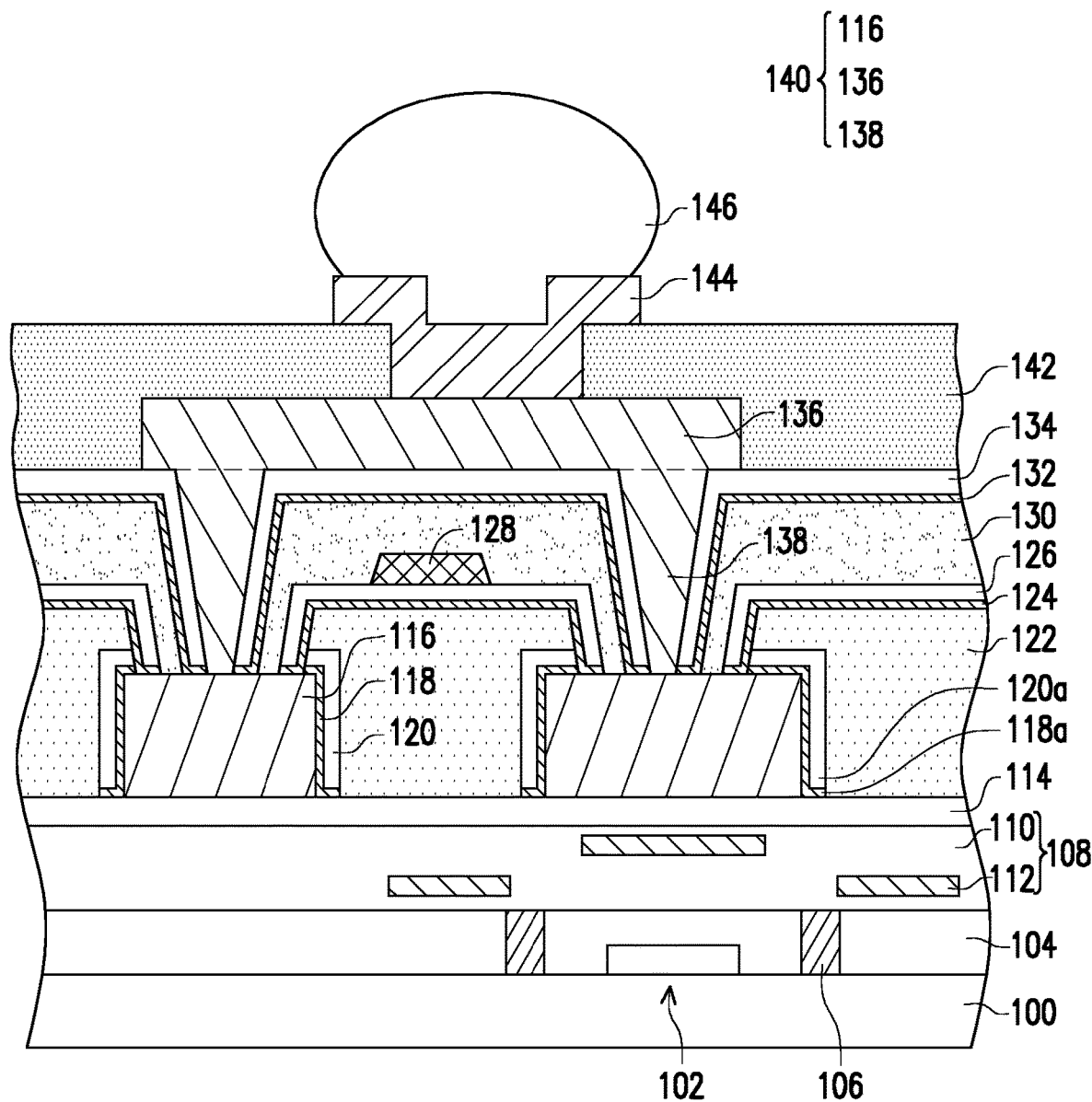

Referring to FIGS. 1 and 2E, in Step S70, a second conductive layer 136 is formed over the organic layer 130 to electrically connect the first conductive layer 116. In some embodiments, the second conductive layer 136 is formed on the inorganic layer 134. In some embodiments, conductive materials are filled into the opening OP4 to form a via 138 in the opening OP4 and the second conductive layer 136 on the via 138. In some embodiments, the second conductive layer 136 is electrically connected to the first conductive layer 116 through the via 138. The via 138 and the second conductive layer 136 include aluminum, copper or a copper alloy. In some embodiments, the second conductive layer 136 may be formed by an electro-plating process. In alternative embodiments, the via 138 and the second conductive layer 136 may include a copper layer coated with electro-less nickel electro-less palladium immersion gold (EN-EPIG), which includes a nickel layer, a palladium layer on the nickel layer, and a gold layer on the palladium layer. The gold layer may be formed using immersion plating. In yet alternative embodiments, other conductive materials may be used to form the via 138 and the second conductive layer 136. It should be appreciated by those skilled in the art that the number and the size of the vias 138 is merely an example, and the number and the size of the vias 138 is not limited by the embodiments of the disclosure. Similarly, although the second conductive layer 136 is electrically connected to the two first conductive layers 116, the disclosure is not limited thereto. In some alternative embodiments, the second conductive layer 136 may be electrically connected to one or more than two first conductive layers 116.

In some embodiments, the first conductive layer 116, the second conductive layer 136 and the via 138 therebetween form a post-passivation interconnect (PPI) structure 140 over the magnetic layer 128. The magnetic layer 128 is insulated from the PPI structure 140 by the organic layer 130, the silicon layer 132 and the inorganic layer 134. In some embodiments, the PPI structure 140 is a spiral, and the magnetic layer 128 is disposed in a central region of the spiral, for example. In some embodiments, the second conductive layer 136 may be formed as a connecting pad at an end of the spiral structure, for example. In some embodiments, the PPI structure 140 and the magnetic layer 128 form a magnetic inductor structure, for example.

In some embodiments, a dielectric layer 142 is formed on the inorganic layer 134 to encapsulate the second conductive layer 136. In some embodiments, the dielectric layer 142 may be formed of a polymer such as an epoxy, polyimide, benzocyclobutene (BCB), polybenzoxazole (PBO) or the like. The dielectric layer 142 may be formed by a suitable method such as spin-coating, lamination, deposition or the like.

Referring to FIGS. 1 and 2E, in Step S80, an under bump metallization (UBM) layer 144 and a bump 146 to electrically connect the second conductive layer 136. In some embodiments, the UBM layer 144 is formed in and on the dielectric layer 142 to electrically connect to the second conductive layer 136. In some embodiments, the UBM layer 144 includes copper, nickel, titanium, a combination thereof, or the like, and is formed by an electroplating process. Then, the bump 146 is formed over and electrically connected to the UBM layer 144. In some embodiments, the bump 146 includes a conductive material with low resistivity, such as Sn, Pb, Ag, Cu, Ni, Bi or an alloy thereof, and may be formed by a suitable process such as evaporation, plating, ball drop, or screen printing. A semiconductor structure including the magnetic inductor structure and the bump 146 is thus completed. In some embodiments, the magnetic inductor structure and the package structure are formed in the same region, but the disclosure is not limited thereto. In some alternative embodiments, the substrate 100 may have a first area and a second area adjacent to the first area, the first area is an area where a magnetic inductor structure is formed, and the second area is a package area configured to bond the semiconductor device to an application specific integrated circuit (ASIC).

Figure 3:
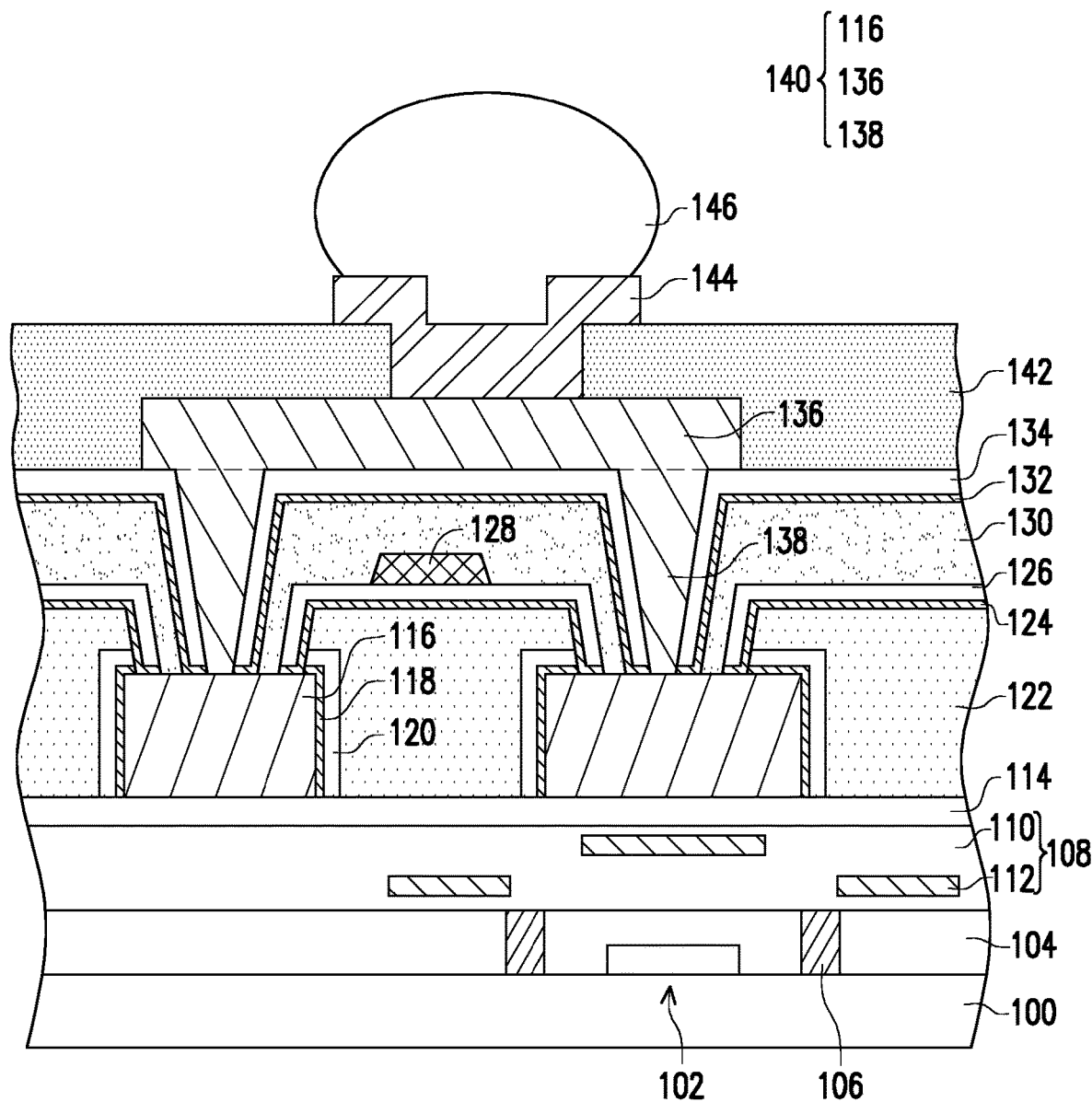
FIG. 3 is a schematic cross-sectional view of a semiconductor device in accordance with some embodiments.
Figure 4:
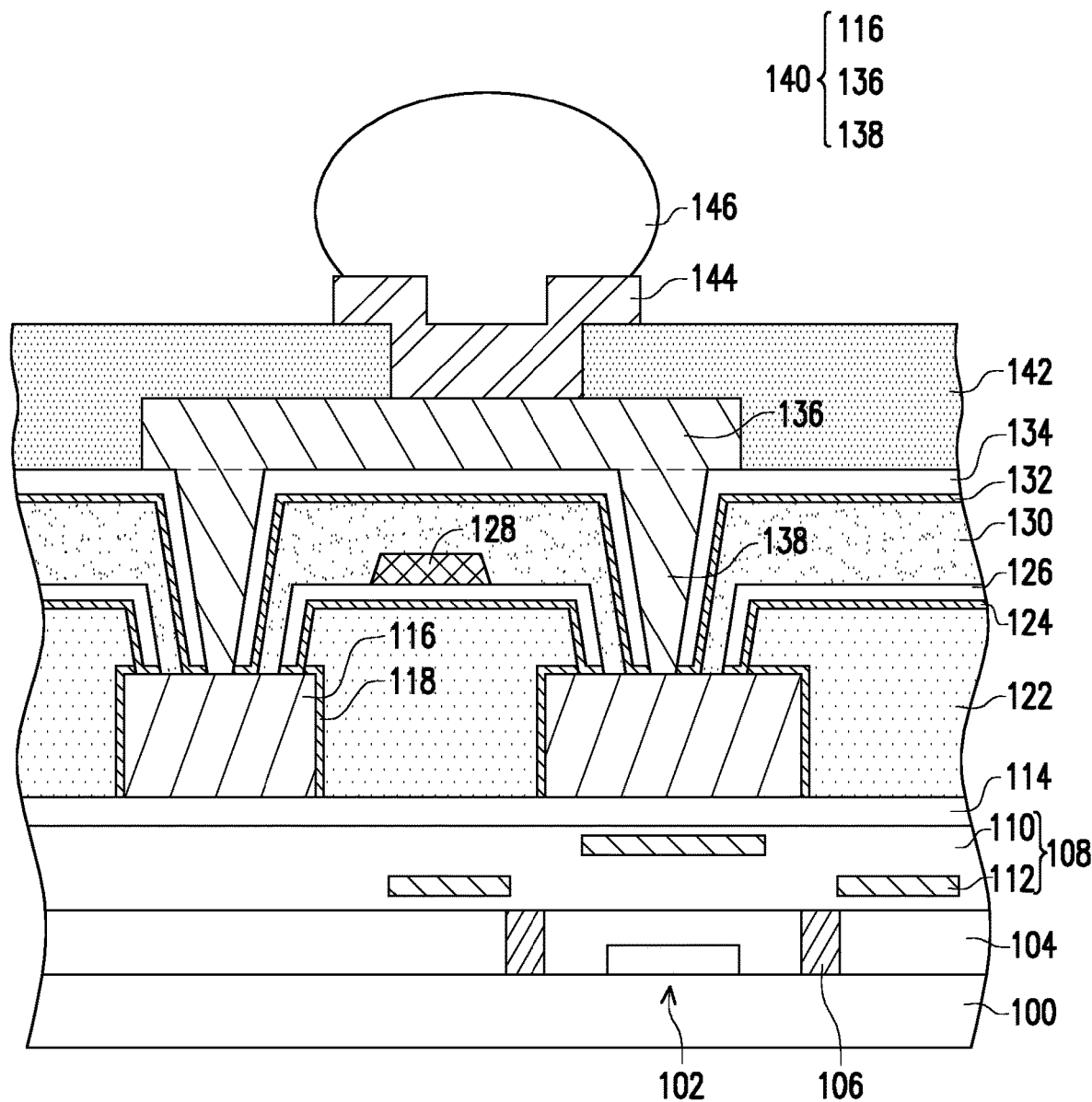
FIG. 4 is a schematic cross-sectional view of a semiconductor device in accordance with some embodiments.

In some embodiments, as shown in FIG. 2A, the silicon layer 118 and the dielectric layer 120 are formed by the same patterning process, but the disclosure is not limited thereto. In some alternative embodiments, as shown in FIG. 3, the silicon layer 118 and the dielectric layer 120 may be formed by different patterning process. That is, a material layer (not shown) of is blanket formed on the first conductive layer 116 and the passivation layer 114, and patterned to form the silicon layer 118 by using a first mask. Then, a material layer (not shown) of is blanket formed on the silicon layer 118 and the passivation layer 114, and patterned to form the dielectric layer 120 by using a second mask different from the first mask. Thus, as shown in FIG. 3, an entire silicon layer 118 is inside the dielectric layer 120, and the dielectric layer 120 covers an entire exposed surface the silicon layer 118. Accordingly, the silicon layer 118 is not exposed, for example. In addition, in some alternative embodiments, as shown in FIG. 4, the dielectric layer 120 may be omitted, that is, the organic layer 122 is formed on and in physical contact with the silicon layer 118, and the adhesion of the organic layer 122 to the first conductive layer 116 is also improved.

In some embodiments, the semiconductor device includes the first conductive layer 116, the magnetic layer 128, the second conductive layer 136, the organic layer 122, 130, the inorganic layer 126, 134 and the silicon layer 124, 132 between the organic layer 122, 130 and the inorganic layer 126, 134. In some embodiments, the organic layer 122 may be disposed between the first conductive layer 116 and the magnetic layer 128. In some embodiments, the organic layer 130 may be disposed between the second conductive layer 136 and the magnetic layer 128. Since the inorganic layer 126, 134 is adhered to the organic layer 122, 130 through the silicon layer 124, 132, the adhesion of the inorganic layer 126, 134 to the organic layer 122, 130 is improved. Accordingly, the delamination of the inorganic layer 126, 134 from the organic layer 122, 130 is prevented, and the reliability of the semiconductor device is improved. In addition, in some embodiments, the silicon layer 118 is formed between the first conductive layer 116 and the organic layer 122, and thus the adhesion of the organic layer 122 to the first conductive layer 116 is improved. Accordingly, the delamination of the organic layer 122 from the first conductive layer 116 is prevented, and the reliability of the semiconductor device is improved. In some embodiments, the silicon layers 124, 132 are formed between the organic layers 122, 130 and the inorganic layers 126, 134 respectively, for example. In some alternative embodiments, one of the silicon layers may be omitted, that is, the insertion of the silicon layer between the organic layer and the inorganic layer may be determined according to the requirements.

Conventionally, in the semiconductor device including the magnetic inductor structure, the high topography structure and thus high film stress induce serious delamination and poor adhesion between the organic layer and the inorganic layer or the organic layer and the conductive layer. In some embodiments, by inserting the silicon layer between the organic layer and the inorganic layer, a covalent bond instead of a hydrogen bond is formed between the silicon layer and the organic layer and the silicon layer and the inorganic layer. Therefore, the adhesion of the organic layer to the inorganic layer is improved. In addition, the silicon layer between the organic layer and the conductive layer improves the adhesion therebetween. Accordingly, the delamination of the organic layer from the inorganic layer or the conductive layer is reduced, and the reliability of the semiconductor device is increased.

In accordance with some embodiments of the present disclosure, a semiconductor device includes a first conductive layer, an organic layer, a silicon layer, a magnetic layer and a second conductive layer. The organic layer is disposed over and exposes a portion of the first conductive layer. The silicon layer is disposed on and in contact with the organic layer. The magnetic layer is disposed over the first conductive layer. The second conductive layer is disposed over the organic layer and the magnetic layer to electrically connect the first conductive layer.

In accordance with alternative embodiments of the present disclosure, a semiconductor device includes a first conductive layer, an organic layer, a silicon layer and a magnetic layer. The organic layer is disposed aside the first conductive layer. The silicon layer is disposed between the organic layer and the first conductive layer. The magnetic layer is disposed over the first conductive layer.

In accordance with yet alternative embodiments of the present disclosure, a method of forming a semiconductor device includes at least the following steps. An organic layer is formed over a first conductive layer, wherein a portion of the first conductive layer is exposed. A silicon layer is formed on the organic layer, wherein the silicon layer is in contact with the organic layer. A magnetic layer is formed over the first conductive layer. A second conductive layer is formed over the organic layer and the magnetic layer to electrically connect the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive layer comprising a first surface;
an organic layer disposed over the first surface of the first conductive layer;
a silicon layer disposed on and in contact with the organic layer, and extended onto and in contact with the first surface of the first conductive layer;
a magnetic layer disposed over the first conductive layer; and
a second conductive layer disposed over the organic layer and the magnetic layer to electrically connect the first conductive layer.

2. The semiconductor device of claim 1, wherein the silicon layer is an amorphous silicon layer.

3. The semiconductor device of claim 1 further comprising a non-conductive inorganic layer, wherein the silicon layer is disposed between the organic layer and the non-conductive inorganic layer, and the non-conductive inorganic layer is not in contact with the first conductive layer.

4. The semiconductor device of claim 1, wherein the organic layer is disposed between the first conductive layer and the magnetic layer.

5. The semiconductor device of claim 1, wherein the organic layer is disposed between the second conductive layer and the magnetic layer.

6. The semiconductor device of claim 1 further comprising a bump disposed over and electrically connecting the second conductive layer.

7. The semiconductor device of claim 1, wherein the organic layer comprises a second surface and a sidewall between the first surface of the first conductive layer and the second surface, and the silicon layer is disposed on the second surface, the sidewall surface and the first surface.

8. The semiconductor device of claim 1, further comprising an additional silicon layer, wherein the additional silicon layer is disposed between a sidewall of the first conductive layer and the organic layer.

9. A semiconductor device, comprising:
a first conductive layer;
an organic layer and a non-conductive inorganic layer, disposed over the first conductive layer;
a silicon layer, disposed between and in contact with the organic layer and the non-conductive inorganic layer, wherein the organic layer is disposed between the silicon layer and the first conductive layer; and
a magnetic layer disposed over the first conductive layer.

10. The semiconductor device of claim 9, wherein the silicon layer is an amorphous silicon layer.

11. The semiconductor device of claim 9 further comprising a dielectric layer disposed between the organic layer and the first conductive layer, and the dielectric layer is not in contact with the first conductive layer.

12. The semiconductor device of claim 9, wherein the silicon layer is further disposed on and in contact with a sidewall and a top surface of the first conductive layer.

13. The semiconductor device of claim 9 further comprising a bump electrically connecting the first conductive layer.

14. The semiconductor device of claim 9, wherein a silicon concentration of the silicon layer ranges from 40% to 100%.

15. A method of forming a semiconductor device, comprising:
- forming an organic layer over a first conductive layer, wherein a first surface of the first conductive layer is exposed;
- forming a silicon layer on the organic layer, wherein the silicon layer is in contact with the organic layer and the silicon layer is extended onto and in contact with the first surface of the first conductive layer;
- forming a magnetic layer over the first conductive layer; and
- forming a second conductive layer over the organic layer and the magnetic layer to electrically connect the first conductive layer.

16. The method of claim 15, wherein the silicon layer is formed by plasma-enhanced chemical vapor deposition (PECVD).

17. The method of claim 15 further comprising performing a plasma treatment on the organic layer before forming the silicon layer.

18. The method of claim 15 further comprising forming a non-conductive inorganic layer on the silicon layer, wherein the silicon layer is disposed between the organic layer and the non-conductive inorganic layer.

19. The method of claim 15, wherein the organic layer is formed between the first conductive layer and the magnetic layer.

20. The method of claim 15, wherein the organic layer is formed between the second conductive layer and the magnetic layer.

* * * * *